(12) United States Patent
Wittmer et al.

(10) Patent No.: US 7,524,424 B2
(45) Date of Patent: Apr. 28, 2009

(54) APPARATUS AND METHOD OF GENERATING A RINGING MAGNETIC PULSE FOR THE TREATMENT OF FLOWING LIQUIDS

(75) Inventors: Kenneth E. Wittmer, Newtown, CT (US); Walter F. J. Crewson, Munsonville, NH (US)

(73) Assignee: Clearwater Systems Corporation, Essex, CT (US)

( * ) Notice: Subject to any disclaimer, the term of this patent is extended or adjusted under 35 U.S.C. 154(b) by 0 days.

(21) Appl. No.: 11/899,050

(22) Filed: Sep. 4, 2007

(65) Prior Publication Data

US 2007/0295671 A1 Dec. 27, 2007

Related U.S. Application Data

(63) Continuation-in-part of application No. 11/192,452, filed on Jul. 27, 2005.

(60) Provisional application No. 60/634,959, filed on Dec. 10, 2004.

(51) Int. Cl.
*B01D 17/12* (2006.01)
*C02F 1/48* (2006.01)

(52) U.S. Cl. .................. 210/748; 210/143; 210/222; 210/243; 204/554; 204/555; 204/660; 204/661

(58) Field of Classification Search .................. 210/174, 210/175, 186, 194, 222, 223, 257, 1, 258, 210/695, 143, 243, 748; 204/554, 555, 660, 204/661
See application file for complete search history.

(56) References Cited

U.S. PATENT DOCUMENTS 5,702,600 A * 12/1997 Pandolfo ..................... 210/222
6,063,267 A * 5/2000 Crewson et al. ............. 210/143

* cited by examiner

*Primary Examiner*—David A Reifsnyder
(74) *Attorney, Agent, or Firm*—Michaud-Duffy Group LLP (57) ABSTRACT

A fluid is treated by coil assembly close to the fluid. An AC power is provided to the coil assembly. Current is conducted from the AC source in a first loop including a first switch during at least a portion of a first half-cycle of the AC power source. The first switch is opened during a second half-cycle and a subroutine of producing a first ringing pulse in the coil assembly and a second and subsequent ringing pulse is performed. The second pulse may be produced after or before the preceding pulse substantially decays. An apparatus for the method includes a controller configured to close the first switch and open the second switch during the first half-cycle and to perform the subroutine of closing and then opening the second switch during the second half-cycle to produce at least one ringing pulse of current in the coil assembly.

38 Claims, 4 Drawing Sheets

APPARATUS AND METHOD OF GENERATING A RINGING MAGNETIC PULSE FOR THE TREATMENT OF FLOWING LIQUIDS

CROSS-REFERENCE TO RELATED APPLICATION

This application is a continuation-in-part of U.S. patent application Ser. No. 11/192,452, filed Jul. 27, 2005, which was published as United States Patent Application Publication No. 2006/0124557 and which claimed the benefit of Provisional Patent Application No. 60/634,959 filed on Dec. 10, 2004, all of which are hereby incorporated herein by reference, in their entirety

FIELD OF THE INVENTION

This invention relates generally to the treatment of flowing water or other liquids and more particularly to the treatment of such liquids with a ringing magnetic pulse.

BACKGROUND

In the past, various different devices and methods have been proposed for treating liquids with electromagnetic flux for the purpose of reducing the scaling propensity of the liquid, for reducing the number of living microorganisms contained in the liquid or for other purposes. For example, an apparatus for treating flowing liquid with electromagnetic flux is disclosed in U.S. Pat. No. 6,063,267 assigned to Clearwater Systems, LLC, the disclosure of which is herein incorporated by reference.

Some of these prior devices have used either stationary or movable permanent magnets for producing a magnetic flux. Other devices have used electrical coils arranged in various different ways with respect to pipes conducting the liquid. These devices create an electromagnetic flux used as the liquid treatment factor by energizing the coils with either a direct or alternating source. In the case of devices using electromagnetic flux, it is known from U.S. Pat. No. 5,702,600 to provide an apparatus including a plurality of electrical coils surrounding different separate longitudinal sections of a liquid conducting pipe, with two of the coils being wound on top of one another, a diode being so connected in circuit with the coils and with the power source that current from the power source is conducted through the coils only during alternate half-cycles of one voltage polarity, with some current of a ringing nature apparently flowing through each coil following the end of each half-cycle of diode conduction. Devices of this type produce two types of electromagnetic fields. During the portion of the AC power cycle in which the diode conducts, the coils produce a low frequency (commonly 50 or 60 Hz) electromagnetic field. The generation of this field requires that substantial current flow through the diode and the coils. During the portion of the AC power cycle in which the diode does not conduct, the coils, in conjunction with stray or discrete capacitance in the circuit, generates a high frequency ringing electromagnetic field. Both types of electromagnetic fields generated are thought to be significant in the treatment of flowing liquids. However, the ringing current, and the electromagnetic flux produced by devices such as that described in the '600 patent appear to be weak and of very short duration so as to be of small effectiveness.

Prior systems for treating flowing liquids with a ringing magnetic pulse used a diode switch to interrupt the coil current when the current reversed polarity. For example, a prior analog control system produced a relatively small "ringing" pulse on the coil voltage when the current was blocked by the diode because there was still voltage remaining on the coil capacitance. The analog control system was modified to generate a much larger "ringing" voltage of up to ten times that of the above-mentioned previous analog control system. This design used in place of the diode, a switch comprising up to ten parallel-connected 450 volt MOSFETs. This switch interrupted the current flow before the coil current reached zero, leaving stored magnetic energy in the coil which powered the larger "ringing" pulse. With this approach, a switch is needed that can be electronically "turned off", and such switches tend to be low current devices with relatively high "ON state" resistance. As a result, ten switches in parallel are needed to handle the full coil current.

Digital control systems have been developed in order to improve stability of operation relative to that of the above-mentioned prior analog control systems. However, there is still a need to lower the complexity and cost of such digital control systems. Irrespective of whether digital or analog control is used, devices of this type produce ringing pulses which are believed to provide better fluid treatment, however, the circuitry required to produce both the low frequency and ringing electromagnetic fields in these devices is sufficiently complex and inefficient so as to be considered less than desirable.

Accordingly, it is a general object of the present invention to provide an apparatus and method of treating liquid with a ringing magnetic pulse which overcomes the above-mentioned drawbacks and disadvantages in generating both low and high frequency electromagnetic fields associated with prior systems and methods of treating liquids.

SUMMARY OF THE INVENTION

The present invention resides in one aspect in a method for treating a flow of fluid. The method comprises providing a coil assembly in proximity to the flow. An AC power source having a period including a first half-cycle of one polarity and a second half cycle of a polarity opposite to that of the first half-cycle is provided to the coil assembly. Current is conducted from the AC power source in a first loop comprising the AC power source, the coil assembly and a first switch, during at least a portion of a first half-cycle of the AC power source. The first switch is opened during a second half-cycle of the AC power source and a subroutine of producing at least a first ringing pulse in the coil assembly and, before the first large ringing pulse substantially decays, producing a second large ringing pulse in the coil assembly is performed.

In an alternative aspect, the first large ringing pulse is permitted to substantially decay, and then the second large ringing pulse is produced in the coil assembly.

The present invention resides in another aspect in an apparatus for electromagnetically treating a flow of liquid. The apparatus comprises a coil assembly and an AC power source connected with the coil assembly. The AC power source has a period including a first half-cycle of one polarity and a second half cycle of a polarity opposite to that of the first half-cycle. There is a first switch connected in series with the coil assembly to form a series connected circuit. A second switch is connected with the coil assembly to form a second circuit. There is a control means for the first switch and the second switch, the control means being configured to close the first switch and open the second switch during a first half-cycle of the AC power source period. Furthermore, during a second half-cycle, the control means performs a subroutine of closing and then opening the second switch to produce at least one large ringing pulse in the coil assembly and, before the first large ringing pulse substantially decays, closing and opening the second switch to produce a second large ringing pulse.

In an alternative embodiment, the subroutine comprises closing and then opening the second switch to produce a first large ringing pulse in the coil assembly and, after the first large ringing pulse substantially decays, closing and opening the second switch to produce a second large ringing pulse.

The invention also resides in other details of method of operation and construction of the apparatus as set forth in the appended claims, and these details will be apparent from the following detailed description of the preferred embodiment of the invention, from the accompanying drawing and from the claims themselves

DETAILED DESCRIPTION OF THE INVENTION

Figure 1:
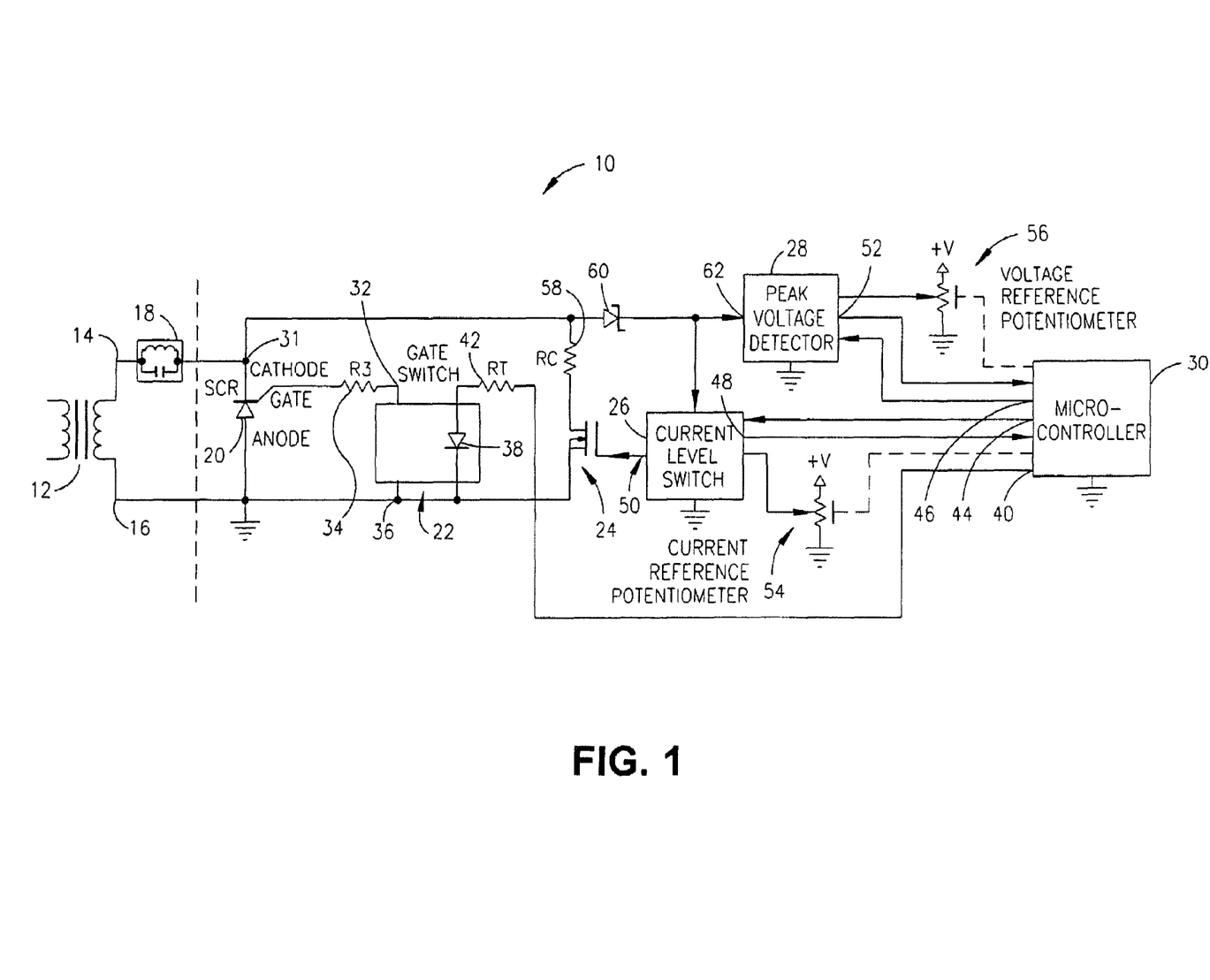
FIG. 1 is a schematic circuit diagram of an apparatus for generating a ringing magnetic pulse for treating flowing liquid in accordance with the invention.

With reference to FIG. 1, an apparatus for generating a ringing magnetic pulse for treating flowing liquids in accordance with the present invention is indicated generally by the reference number 10. The apparatus 10 comprises an input power transformer 12 having first and second output terminals 14, 16, a coil assembly 18, an SCR 20, a optical relay 22, a MOSFET 24 serving as an electronically controlled switch, a current level switch 26, a peak voltage detector 28, and a programmable digital microcontroller 30.

It has been discovered that digital control systems for generating a ringing magnetic pulse can be modified in order to be of simpler construction and less expensive by substituting a single silicon controlled rectifier (SCR) switch for a MOSFET switch assembly. This substitution provides significant benefits in the generation of the ringing pulse as well as the low frequency electromagnetic field, both of which are considered important in the treatment of fluids. SCRs are available with higher current ratings and lower losses relative to MOSFETs, and a single device can easily handle the coil current. As a result of using the SCR where prior art devices employed a MOSFET, the ringing pulse and the low frequency electromagnetic field are generated more efficiently than in previous devices. However, SCRs cannot be electronically turned off as a MOSFET can, so that the high voltage "ringing" pulse has to be produced some other way than by interrupting the coil current pulse, as will be explained more fully below.

Referring again to FIG. 1, the coil assembly 18, which comprises a coil and is characterized as having an inductance and a capacitance connected in parallel, has a first end coupled to the first terminal 14 of the transformer 12. The illustrated capacitance can be and is herein taken to be comprised solely of the capacitance of the coil, but in some coils the stray capacitance may be supplemented by a discrete capacitor connected in parallel with the coil. The SCR 20 has a cathode coupled to a second end 31 of the coil assembly 18, and an anode coupled to the second output terminal 16 of the transformer 12. As shown, the anode of the SCR 20 is coupled to electrical ground. The optical relay 22 serves as an SCR gate switch. As shown in FIG. 1, the optical relay 22 has a first terminal 32 coupled to the gate of the SCR 20 via a gate resistor 34, and a second terminal 36 coupled to ground potential. The optical relay 22 includes a light emitting diode (LED) 38 that when energized to emit light closes the gate switch to enable current flow between the first and second terminals 32, 36 of the optical relay 22. Thus, the coil assembly 18 and the SCR 20 form a series connected circuit in parallel to the power transformer 12, making a first loop. In one embodiment, the optical relay 22 may comprise a triac; in another embodiment, the optical relay may comprise a MOSFET.

The microcontroller 30 includes a first output 40 coupled to an anode of the LED 38 via a resistor 42, a second output 44 coupled to the current level switch 26, and a third output 46 coupled to the peak voltage detector 28. The current level switch 26 includes a first output 48 coupled to the microcontroller 30, and a second output 50 coupled to the gate of the MOSFET 24. The peak voltage detector 28 includes an output 52 coupled to the microcontroller 30. A digitally controlled current reference potentiometer 54 is coupled to an input of the current level switch 26, and is adjustable by the microcontroller 30. A digitally controlled voltage reference potentiometer 56 is coupled to the peak voltage detector 28, and is adjustable by the microcontroller 30.

The MOSFET 24, such as the illustrated n-channel IGFET with substrate tied to source, includes a source coupled to ground potential, and a drain coupled to the second end 31 of the coil assembly 18 via a current sense resistor 58. A high voltage Schottky diode 60 has an anode coupled to the second end 31 of the coil assembly 18 and a cathode coupled to an input 62 of the peak voltage detector 28.

The apparatus 10 is generally preferably mounted on a printed circuit board (not shown). However, two components are preferably external to the printed circuit board (PCB), namely, the coil assembly 18 and the power transformer 12. The transformer 12 provides a 50-60 Hz AC power to power the coil assembly 18. The main power component on the PCB is the SCR 20 which is preferably heat-sinked and which functions as a controllable diode. When an ordinary diode is forward-biased (anode voltage positive with respect to the cathode) it conducts current. When an SCR is forward-biased it will not conduct current unless the gate (control) lead is also forward-biased. Both an SCR and an ordinary diode will block current if they are reverse-biased.

When the SCR gate lead is connected to its anode (via a resistor), the SCR will conduct current when the SCR anode is positive with respect to its cathode. This occurs during the negative voltage half-cycle (as referenced to the SCR anode which is considered to be circuit ground in FIG. 1). Since the coil assembly 18 is predominantly inductive (with some small internal resistance) at 60 Hz, negative current will continue to flow for a large portion of the positive voltage half-cycle. When the current drops to zero, the SCR 20 will block positive current flow (from cathode to anode) as does a diode rectifier. When the SCR 20 turns off, the voltage across the SCR will jump to a positive level during the remainder of the positive voltage half-cycle. It is during this positive voltage period that the microcontroller 30 generates at least one ringing current and voltage pulse within the coil assembly 18.

A ringing pulse across the coil assembly 18 is created by first closing the MOSFET solid-state switch 24 for a brief period at any time during the positive voltage cycle when the SCR 20 is off. The MOSFET 24 is closed, or made to conduct, by applying a positive voltage to its control electrode or gate via the current level switch 26. Positive current will build up in the coil assembly 18 while the MOSFET 24 is closed (the rise time is determined by the value of the current sense resistor 58 and the inductance of the coil assembly 18). When the current level reaches a designated trigger value, the MOSFET switch 24 is abruptly opened by the current level switch 26 (the current level switch removes the positive voltage from the gate of the MOSFET 24, which causes the MOSFET to become non-conducting). The inductance and capacitance values of the coil assembly 18 will determine the frequency of the resulting resonating current flow within the coil and the magnitude of the ringing voltage as viewed across the SCR 20. The decay time of the ring is determined by the internal resistance of the coil assembly 18.

The gate resistor 34 of the SCR 20 must be disconnected from the anode of the SCR during the positive voltage period to prevent the SCR from turning on when ringing pulses are generated—which would quickly terminate the ring. An optical relay 22 (as shown in FIG. 1) is provided for this purpose. The optical relay 22 need only be energized prior to the start of the negative voltage half-cycle. Once current starts to flow in the SCR 20, the optical relay 22 can be de-energized. The SCR 20 will continue to conduct until current drops to zero and the cathode-to-anode voltage across the SCR is positive. Interestingly, a small ringing pulse in the coil assembly 18 occurs when the SCR 20 switches off which is caused by the charge stored in the coil capacitance.

The operation of the apparatus 10 is primarily implemented using the programmable digital microcontroller 30 coupled to and aided by the peak voltage detector 28 and the current level switch 26. The microcontroller 30 does not directly interface with the coil assembly 18, the SCR 20 and the MOSFET 24; nor does the microcontroller directly view the coil voltage level. The coil voltage is presented to the current level switch 26 and the peak voltage detector 28 through the high voltage Schottky diode 60. The current level switch 26 and the peak voltage detector 28 compare the incoming voltage level to a reference voltage level set by the digitally controlled potentiometers 54, 56, respectively to determine its action.

The primary function of the peak voltage detector 28 is to compare the level of the coil ringing voltage signal to the reference level set by the digital potentiometer 56 associated with the peak voltage detector. If the peak level exceeds the given reference level, the peak voltage detector 28 will store that event so that it can be later read by the microcontroller 30. The stored event is cleared after it is read by the microcontroller 30. The peak voltage detector 28 is used to determine that the peak voltage exceeds the minimum desired value and also that it does not exceed a maximum value. A secondary function of the peak voltage detector 28 is to determine the value of the transformer voltage on start-up. The microcontroller 30 needs to know the transformer voltage because the ring signal rides on top of the transformer voltage. The transformer voltage reading is added to the desired ring voltage level when the reference voltage is set.

The current level switch 26 controls the MOSFET 24 used to generate the coil ringing pulse. The microcontroller 30 sends a trigger pulse to the current level switch 26 to initiate a ring. When triggered, the current level switch 26 raises the voltage on the gate lead of the MOSFET 24, thereby turning it on. The "on" resistance of the MOSFET 24 is much less than the value of the current sense resistor 58. The MOSFET 24 is held "on" until the voltage at the current sense resistor 58—coil junction (the cathode of the SCR 20) exceeds the reference voltage set by the current reference potentiometer 54 associated with the current level switch 26. The value of the resistor 58 and the reference voltage is not as important as ensuring that the current value at which the MOSFET 24 turns off is repeatable for a given potentiometer setting. The role of the microcontroller 30 is to adjust the potentiometer 54 of the current level switch 26 to achieve the desired voltage level for the coil "ring." Thus, the microcontroller 30, potentiometer 54 and current level switch 26 regulate at least the initial voltage of the ringing current pulse. Optionally, the microcontroller 30, potentiometer 54 and current level switch 26 are adapted to keep the voltage of the ringing current plus between a predetermined minimum value and a predetermined maximum value.

The overall operation of the microcontroller 30 is executed in software embedded within the microcontroller. The functions of that software program are now described. When the apparatus 10 is first powered-up, the SCR 20 and the MOSFET 24 are both off (i.e. no current flows through the coil assembly 18). The first task of the microcontroller 30 is to test for the presence of coil power voltage from the transformer 12. This can be accomplished by setting the peak voltage detector 28 at a low level and monitoring the output. An alternative method is to monitor a tap provided in the current level switch 26 which reads zero when the coil voltage is negative and rises to +0.5V when the coil voltage goes positive. The microcontroller 30 waits until it observes two alternating 50-60 Hz power line voltage cycles before proceeding. When the AC coil voltage is detected, the microcontroller 30 will measure its peak level by monitoring the output of the peak voltage detector 28 while it raises the level of the voltage reference potentiometer 56. The peak level reading is retained in the microcontroller 30 and used as an offset for adjusting the level of the generated ring pulses which ride on the coil power voltage.

The next software task is to turn on the SCR 20, which is a periodic task occurring once per voltage cycle. Since the SCR anode is used as the ground-reference, the SCR anode-to-cathode voltage is negative during the positive voltage portion of the cycle. Just before the end of the positive voltage period, the SCR gate switch or optical relay 22 is turned on by powering its optically coupled LED 38. When the negative voltage across the SCR 20 is approximately 2 volts, the SCR will begin to conduct current, at which time power to the gate switch LED 38 is removed. The SCR 20 will remain latched on without the gate switch 22 being powered, until the SCR 20 current flow drops to zero.

The ringing pulses are produced by a second periodic software task. This task waits until the SCR 20 turns off and a positive coil voltage is detected (which is a sharp jump nearly the height of the peak coil voltage). The task waits a few milliseconds to allow the small coil ring (which occurs when the SCR 20 turns off) to die out. To generate a high voltage ringing pulse the software sends a trigger signal to the current level switch 26, which turns on the MOSFET 24, allowing positive current flow to rise in the coil assembly 18. The task monitors the current level switch 26. When the current level switch signals that the desired amount of current is present in the circuit, the MOSFET is turned off. The rapid cessation of the flow of current in the coil triggers a large coil ring.

The microcontroller generates a sequence of large ringing pulses in the second half-cycle of the AC power source. The timing of each ringing pulse in a sequence may be timed in relation to the preceding pulse. For example, the microcontroller may delay the generation of a subsequent ringing pulse for an idle period until the preceding ringing pulse substantially decays. For one example of such substantial decay, the generation of a subsequent ringing pulse may be delayed at least until the magnitude of a preceding pulse decays to about 5% of the initial magnitude. Following this idle period, the periodic software task is repeated and a second or subsequent large ringing pulse is generated. The number of pulses which may be generated during each positive voltage period depends on the inductance, capacitance, resistance, and voltage in the circuit; 4-6 rings are typical.

In an alternative embodiment, the microcontroller is programmed so that the wait time from when the MOSFET 24 is turned off to when the MOSFET 24 is turned on again in preparation for generating the next ring is shorter than in the preceding embodiment of the invention. As a result of this shorter wait period, the generation of significantly greater number of rings is possible during each positive voltage period, however, each ring is not permitted to substantially decay as it was in the first embodiment. For example, a subsequent ringing pulse may be generated before the preceding ringing pulse decays to about 5%, or to about 10%, of its initial magnitude. Optionally, a subsequent ringing pulse may be generated before the previous ringing pulse decays to about 25%, optionally before the previous ringing pulse decays to about 50% of its initial magnitude. In some embodiments, a subsequent ringing pulse may be generated when the magnitude of the preceding pulse decays to about 10 to about 50% of the initial magnitude. Optionally, a subsequent pulse may be generated when the magnitude of the preceding pulse decays by about 15 to about 25% of the initial magnitude.

During the negative voltage period, the microcontroller 30 determines if the peak voltage detector 28 has been triggered, which indicates that ringing signal exceeded the reference level set in the voltage reference potentiometer 56. The voltage reference potentiometer 56 can be set to either the minimum or the maximum desired peak voltage level. If the voltage reference potentiometer 56 is set for the minimum peak voltage, and the peak voltage detector 28 has not been triggered, the microcontroller 30 will increase the level of the current reference potentiometer 54 and leave the voltage reference potentiometer 56 at the minimum level. If the voltage reference potentiometer 56 is set for the minimum peak voltage, and the peak voltage detector 28 has been triggered, the microcontroller 30 will hold the level of the current reference potentiometer 54 and change the voltage reference potentiometer 56 to the maximum level. If the voltage reference potentiometer 56 is set to the maximum level, and the peak voltage detector 28 has been triggered, the microcontroller 30 will decrease the level of the current reference potentiometer 54 and leave the voltage reference potentiometer 56 at the maximum level. If the voltage reference potentiometer 56 is set to the maximum level, and the peak voltage detector 28 has not been triggered, the microcontroller 30 will hold the level of the current reference potentiometer 54 and change the voltage reference potentiometer 56 to the minimum level. The preceding actions will move and hold the peak voltage level for the ring pulse between the minimum and maximum desired values. The above logic pattern serves as a digital voltage regulator for the ringing voltage pulse.

Also during the negative voltage period, the microcontroller 30 reads the resistance value of a negative temperature coefficient (NTC) thermistor (not shown) affixed to the heat sink of the SCR 20. If the resistance drops below the value equated to the maximum temperature designated for the SCR heat sink (which is lower than destruction level for the SCR 20) the microcontroller 30 will turn off the SCR and also cease generating ringing pulses. The microcontroller 30 will continue to periodically read the thermistor and when it is determined that the SCR temperature has dropped to a safe level, the microcontroller will automatically resume operation.

On the bottom of the printed circuit board can be two status LEDs (not shown)—preferably one red and one green—viewable through holes in a controller cover. The green LED is lit when the microcontroller 30 has determined that the voltage level of the ringing pulses is within the desired range, otherwise the red LED is lit. A single-pole double-throw relay contact (not shown) is preferably provided for remotely monitoring the status—when the green LED is lit the relay is energized.

The functioning of the above-described SCR-switched circuit is as follows: The SCR (Silicon Controlled Rectifier) acts like a diode with a controllable turn-on capability. When voltage is applied in the "forward direction" (forward-biased-anode positive with respect to cathode) a diode will conduct current. However, the SCR will NOT conduct when forward-biased unless a current is made to flow in its "gate" circuit. If no gate current is applied, the SCR will "block" the flow of current even when forward-biased. Both the SCR and the diode will block the flow of current when the direction of current flow reverses (cathode to anode is the reverse-current direction). The SCR cannot be turned off by removing its gate current after it has been turned on. It can only be turned off by reversing the direction of current flow. In this it acts the same as a silicon diode (rectifier). Hence its name, "silicon controlled rectifier".

With this as background, a normal cycle of the system proceeds as follows. The coil, transformer and SCR switch are all connected in series. When the time-varying (50 or 60 cycles per second) transformer voltage applies a forward bias to the SCR, gate current is applied and the SCR conducts current through the coil. The SCR has a very low voltage drop from anode to cathode when conducting (less than or equal to one volt typically) so it acts like an almost-perfect switch. On the circuit boards of prior devices MOSFETs (Metal-Oxide-Silicon Field Effect Transistors) are used as the switch, and these MOSFETs have a larger "forward" voltage drop than does an SCR and so dissipate more heat than the SCR. For this reason, in the prior devices ten parallel-connected MOSFETs are used to carry the coil current, where a single SCR will do the same job in devices according to the present invention with lower overall power loss.

When the coil current attempts to reverse direction, the SCR turns off and allows voltage to rise across it, just as a diode would do. The SCR then blocks current flow when the current reverses. Because the voltage and current across the coil are almost 90 degrees out of phase with each other, the current crosses zero (reverses) when there is still substantial voltage across the coil. This frees the coil to "ring" at a low voltage level due to the energy stored in its stray capacitance.

After this initial small or natural "ringing" pulse has died out, a small current is allowed to build up in the coil by closing a MOSFET switch. This switch does not carry the main coil current, so a small switch can be used for this "recharging" function.

When this current has reached a preset level, the MOSFET is turned off, and the coil voltage "rings" again, this time producing a large ringing pulse at a higher voltage level, depending on the amount of current that is allowed to build up.

The regulator circuit measures the peak value of this "ringing" voltage and compares it to the desired value, which is stored as a number in the microprocessor "chip" on the circuit board. If the voltage is too low, then after the ringing pulse has died away the microprocessor turns the MOSFET on again and holds it "on" for a longer time, allowing more coil current to build up than before. The MOSFET is then turned off, and the large ringing pulse repeats.

If the pulse voltage is too high, the microprocessor reduces the "on time" of the MOSFET switch for the next pulse, causing less coil current to build up. The MOSFET then turns off and the ringing voltage is again measured.

When the ringing voltage has reached the desired level (it falls within a "window" range of voltages stored in the microprocessor), the regulator "remembers" this and fixes the MOSFET "on" time for subsequent pulses at this value unless the pulse voltage drifts outside the "window" again. This can occur if the coil resistance changes as the coil temperature changes during operation. If that occurs, preceding steps are repeated until the voltage is once again within the "window".

All the large "ringing" pulses are generated during the interval when the SCR switch is reverse-biased by the applied circuit voltage from the power transformer. The SCR allows the ringing pulses to occur (its gate current is zero during this interval), even though the ringing pulse voltage will at times cause the SCR voltage to switch over to the "forward" bias condition. The SCR will not turn on when this occurs, unlike a diode, as its gate current is held to zero by the gate driver switch.

Several large ringing pulses can be inserted in the reverse bias time interval. The number of pulses depends on the desired voltage of the pulse, the inductance of the coil, the capacitance in parallel with the coil (including stray capacitance) and the degree to which each pulse is permitted to decay. In a first embodiment of the invention, each pulse is allowed to substantially (optionally, fully) decay and, all other parameters being equal, fewer pulses are produced. In a second embodiment of the invention, the pulses are not permitted to substantially decay prior to the generation of the next pulse; this allows the generation of a significantly greater number of pulses. The difference between these embodiments may be seen by comparing FIGS. 4 and 5.

Other techniques can be used to generate ringing pulses similar to those described above. The preferred technique, as described above, uses the coil's inductance as an energy storage element to generate the ringing voltage, so it is a simpler method than others which must store the energy elsewhere. However, any device that stores the required pulse energy can be used to generate a ringing pulse. For example, a capacitor can be charged to 150 volts (or any other desired voltage) and switched across the coil during the "off time" of the coil current. This too will generate a ringing pulse, but it requires a high voltage power supply and an extra capacitor. This method also increases the capacitance in the "ringing" circuit, and causes a lower "ringing" frequency than our method does. The preferred method uses the unavoidable "stray" capacitance of the coil as the resonating capacitance, and generates the highest possible ringing frequency.

Figure 2:
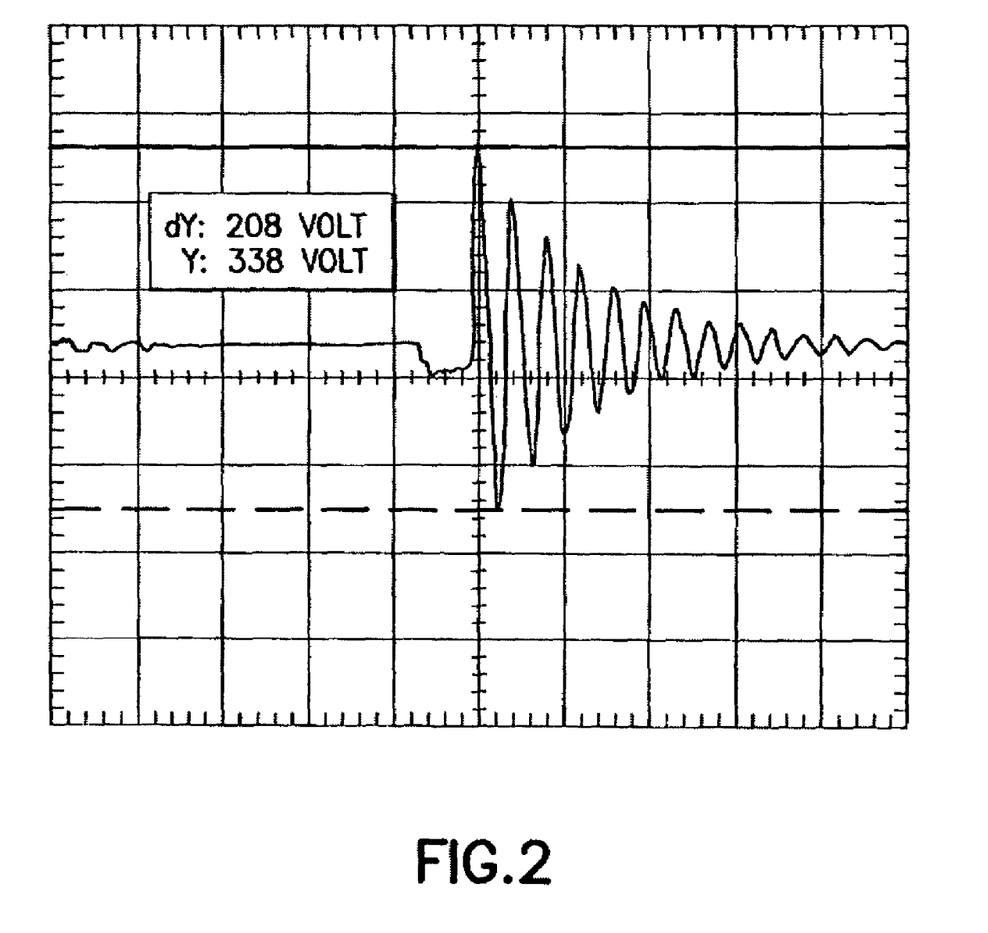
FIG. 2 is an oscilloscope trace showing a single large ringing pulse according to the invention.
Figure 3:
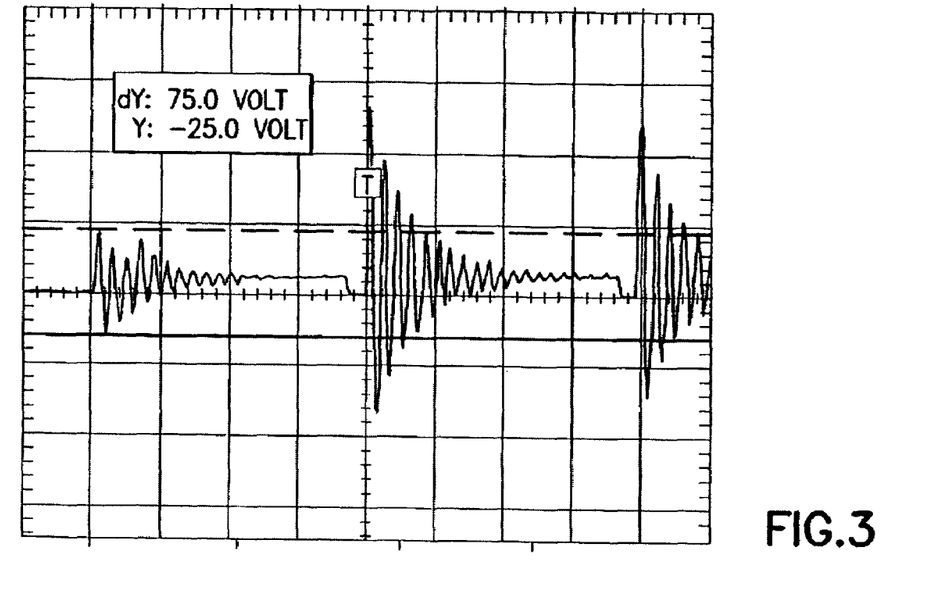
FIG. 3 is an oscilloscope trace showing a "natural" ringing pulse followed by more than one large ringing pulse according to the invention.
Figure 4:
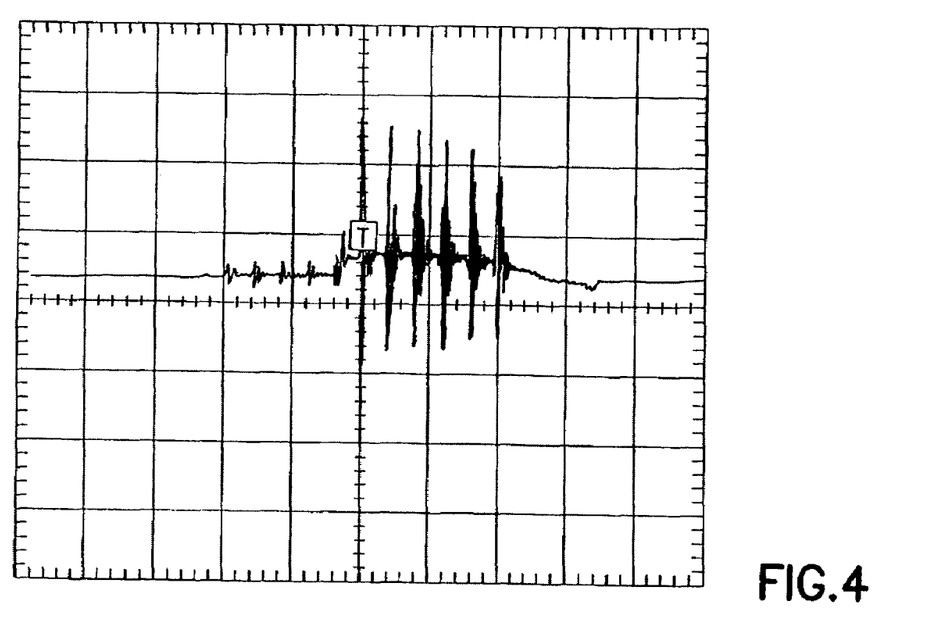
FIG. 4 is an oscilloscope trace showing a series of six full large ringing pulses according to the invention.

A session testing the performance of a device such as shown by FIG. 1 and as described above with a digital scope on a workbench produced the results shown in FIGS. 2, 3 and 4. As can be seen, the inventive control circuit can fit several (in this case six) large ringing pulses into the available "off" time window between transformer current pulses. The number of large ringing pulses is selectable by inputting a number to the control program via the computer programming interface.

FIG. 2 shows a single pulse from the group; the printing at the left indicates the two horizontal cursor lines were 208 volts apart. The sweep speed is 100 microseconds (µs)/division. The voltage scale is 50V/division.

In FIG. 3 is seen the first "natural" ring when the SCR turns off, about 75 volts peak-to-peak. Then come the large rings caused by the control circuit. The large ringing pulses are between three and four times larger in voltage than the small "natural" ringing pulse. More than one large ringing pulse visible in FIG. 3. The sweep speed for this FIG. 3 is 200 µs/division and the voltage scale is 50V/division.

In FIG. 4 we see a full six large ringing pulses. These fit into the approximately 8 millisecond "SCR off" time for this size (one inch) device. With larger coils, this time may be shorter and fewer pulses will fit in. The sweep speed here is 2 ms/division and the voltage scale is 50V/division.

Figure 5:
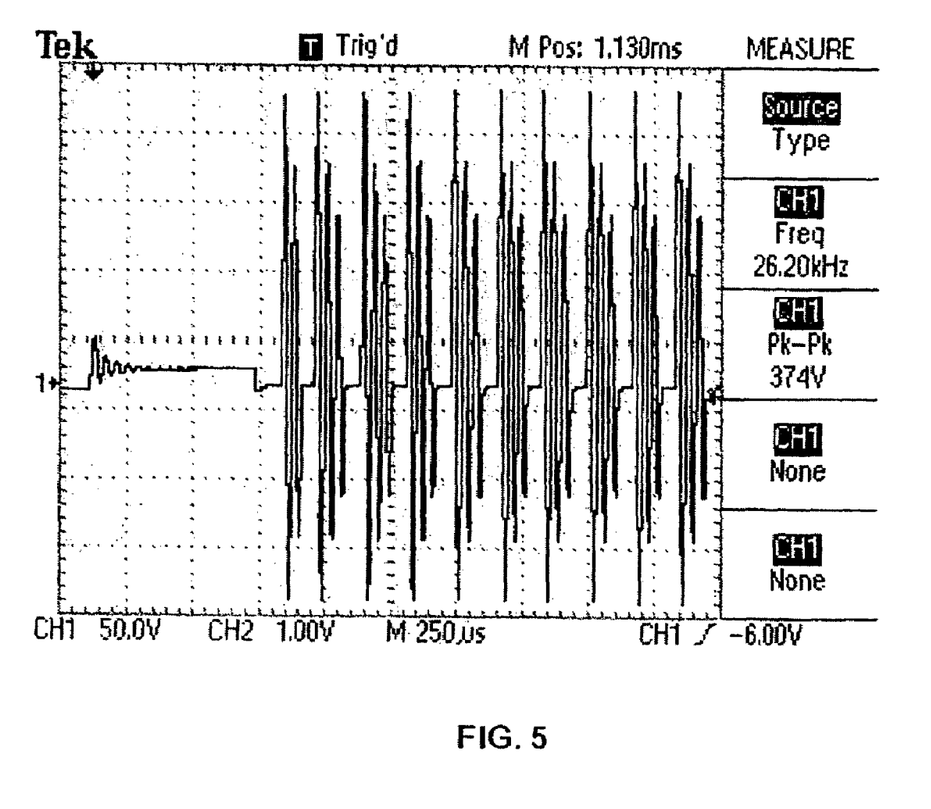
FIG. 5 is an oscilloscope trace showing a series of ringing pulses initiated without letting prior pulses substantially decay, according to one embodiment of the invention.

Finally, FIG. 5 shows the result of more than six ringing pulses in an embodiment in which new ringing pulses are initiated before prior pulses decay.

As is evident from the foregoing description, one or more large ringing pulses is generated within a time interval defined as a portion of a single cycle of a 50 or 60 Hz AC signal. Thus, each such time interval has a duration corresponding to a portion of a cycle of a 50 or 60 Hz signal. Optionally, the one or more large ringing pulses are generated in successive intervals defined as portions of successive cycles of the 50 or 60 Hz AC signal, in which case the one or more large ringing pulses are said to occur in successive intervals spaced at 50 or 60 Hz.

In summary, the apparatus and method embodying the present invention employs an SCR for handling the main coil current which is responsible for the formation of the low frequency electromagnetic field, and uses a single MOSFET switch to draw a relatively small current through the current coil(s) after the main current pulse has ended. One or more large ringing pulse or pulses is then produced by turning this switch off. Several ringing pulses can be produced in this way during the zero current interval through the coils. The number of pulses which may be generated depends on the characteristics of the system and whether each ring is allowed to substantially decay (first embodiment) or whether subsequent rings are generated prior to substantial decay in the previous ring (second embodiment).

One way to practice this invention is to situate a fluid flow in proximity to the coil assembly while ringing pulses are being generated, for example, by flowing the fluid through the magnetic flux generated by the coil assembly during the ringing pulses. In a particular embodiment, an apparatus embodying the invention may comprise a pipe unit that includes a pipe through which liquid to be treated passes. The pipe may be made of various materials, but as the treatment of the liquid effected by the pipe unit involves the passage of electromagnetic flux through the walls of the pipe and into the liquid passing through the pipe, the pipe is preferably made of a non-electrical conducting material to avoid diminution of the amount of flux reaching the liquid. Other parts of the pipe unit may be contained in or mounted on a generally cylindrical housing surrounding the pipe.

The pipe unit includes one or more electrical coils of a coil assembly as described herein, surrounding the pipe, with an AC power source and control circuitry connected to the coil assembly as described herein. The number, design and arrangement of the coils making up the coil assembly may vary. In illustrative embodiments, the coil has four coil sections arranged in a fashion similar to that of U.S. Pat. No. 5,702,600 and U.S. Pat. No. 6,063,267, the disclosures of which are incorporated herein by reference. The coils are associated with different longitudinal sections of the pipe. That is, a first coil section is wound onto and along a bobbin and in turn extending along a first pipe section, a second coil section is wound on and along another bobbin itself extending along the a second pipe section, and third and forth coil sections are wound on a third bobbin itself extending along a third pipe section, with the third coil section being wound on top of the forth coil section. The winding of the third and forth coil sections on top of one another, or otherwise in close association with one another, produces a winding capacitance between those two coils which forms all or part of the capacitance of a series resonant circuit in a coil assembly as described herein. Alternatively, the coils may be wound around the pipe, without the use of a bobbin.

In use, a fluid is passed through the pipe unit, and while the fluid passes therethrough, the AC power source and control circuitry generate low frequency electromagnetic fields and ringing pulses in the coil as described herein.

Due to the complexity of the process for producing the ringing pulses, the majority of this specification is devoted to the method and circuit associated with the generation of the ringing pulse. It should not be construed, however, that the process and equipment associated with the ringing pulse is of any greater importance than the process and equipment associated with the low frequency electromagnetic field.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item. As will be recognized by those of ordinary skill in the pertinent art, numerous modifications and substitutions may be made to the above-described embodiment of the present invention without departing from the scope of the invention. Accordingly, the preceding portion of this specification is to be taken in an illustrative, as opposed to a limiting sense.

What is claimed is:

1. A method for treating a flow of fluid, the method comprising:
   providing a coil assembly in proximity to the flow;
   providing to the coil assembly an AC power source having a period including a first half-cycle of one polarity and a second half cycle of a polarity opposite to that of the first half-cycle;
   conducting current from the AC power source in a first loop comprising the AC power source, the coil assembly and a first switch during at least a portion of a first half-cycle of the AC power source period, and opening the first switch during a second half-cycle of the AC power source period; and
   during the second half-cycle of the AC power source period, performing a subroutine of producing a first large ringing pulse in the coil assembly wherein producing the first large ringing pulse in the coil assembly comprises closing and opening a second switch, the second switch being in a second loop with the coil assembly and, before the first large ringing pulse substantially decays, producing a second large ringing pulse in the coil assembly.

2. The method of claim 1, comprising producing the second large ringing pulse before the first ringing pulse decays by about 50% of its initial magnitude.

3. The method of claim 2, comprising producing a plurality of sequential ringing pulses during the second half cycle of the AC power source, wherein a plurality of ringing pulses are each produced before a ringing pulse prior thereto substantially decays.

4. A method as defined in claim 1, wherein said first switch is a silicon controlled rectifier (SCR).

5. A method as defined in claim 4, wherein the second switch is electrically connected generally in parallel with the SCR.

6. A method as defined in claim 5, wherein the second switch comprises a MOSFET.

7. A method as defined in claim 4, wherein controlling the first switch includes sending a trigger signal to a gate of the SCR and thereupon removing the trigger signal from the gate after the SCR becomes conductive.

8. A method as defined in claim 7, wherein sending a trigger signal includes activating an optical relay to pass the trigger signal to the gate of the SCR and thereafter deactivating the optical relay to remove the trigger signal from the gate of the SCR.

9. A method as defined in claim 4, further comprising completing a predetermined number of cycles of the AC power signal upon start-up prior to conducting current through the first and second loops.

10. A method as defined in claim 4, further comprising monitoring a temperature of the SCR, and thereupon discontinuing the conduction of current through the SCR when a temperature of the SCR exceeds a predetermined maximum value.

11. A method as defined in claim 10, further comprising resuming controlled conduction of current through the SCR when a temperature of the SCR falls below the predetermined maximum value.

12. The method of claim 1, wherein the subroutine includes comparing the current in the coil assembly to a trigger value, and opening the second switch when the coil assembly voltage reaches the trigger value.

13. A method as defined in claim 1, further comprising regulating a voltage of the ringing pulse.

14. A method as defined in claim 13, further comprising adjusting the voltage of the ringing pulse so as to lie between a predetermined minimum value and a predetermined maximum value.

15. A method as defined in claim 14, further comprising measuring AC power across the coil assembly upon start-up, and using the AC power upon start-up as an offset.

16. The method of claim 1, comprising producing a large ringing pulse in each of a plurality of time intervals, each time interval having a duration corresponding to a portion of a cycle of a 50 or 60 Hz signal.

17. The method of claim 16, comprising producing a plurality of large ringing pulses in each of a plurality of time intervals, the time intervals being spaced in a way that corresponds to 50 or 60 Hz.

18. The method of claim 17, wherein each large ringing pulse after the first large ringing pulse within a time interval is initiated before the prior large ringing pulse substantially decays.

19. A method for treating a flow of fluid, the method comprising:
   providing a coil assembly in proximity to the flow;
   providing to the coil assembly an AC power source having a period including a first half-cycle of one polarity and a second half cycle of a polarity opposite to that of the first half-cycle;
   conducting current from the AC power source in a first loop comprising the AC power source, the coil assembly and a first switch during at least a portion of a first half-cycle of the AC power source period, and opening the first switch during a second half-cycle of the AC power source period; and
   during the second half-cycle of the AC power source period, performing a subroutine of producing a first large ringing pulse in the coil assembly wherein producing the first large ringing pulse in the coil assembly comprises closing and opening a second switch, the second switch being in a second loop with the coil assembly and, after the first large ringing pulse substantially decays, producing a second large ringing pulse in the coil assembly.

20. The method of claim 19, comprising producing a plurality of sequential ringing pulses during the second half-cycle of the AC power source, wherein a plurality of ringing pulses are each produced after a ringing pulse prior thereto substantially decays.

21. The method of claim 19, comprising producing a large ringing pulse in each of a plurality of time intervals, each time interval having a duration corresponding to a portion of a cycle of a 50 or 60 Hz signal.

22. The method of claim 21, comprising producing a plurality of large ringing pulses in each of a plurality of time intervals, the time intervals being spaced in a way that corresponds to 50 or 60 Hz.

23. The method of claim 21, wherein each large ringing pulse after the first large ringing pulse within a time interval is initiated after the prior large ringing pulse substantially decays.

24. An apparatus for electromagnetically treating a flow of liquid, said apparatus comprising:
a coil assembly;
an AC power source connected with the coil assembly, the AC power source having a period including a first half-cycle of one polarity and a second half cycle of a polarity opposite to that of the first half-cycle;
a first switch connected in series with the coil assembly to form a series connected circuit;
a second switch connected with the coil assembly to form a second circuit; and
a controller for the first switch and the second switch, the controller being configured to: close the first switch during the first half-cycle of the AC power source period; open the first switch during a second half-cycle of the AC power source period; maintain the second switch in an open condition during a first half-cycle of the AC power source period; and perform a subroutine of closing and then opening the second switch to produce a first large ringing pulse in the coil assembly wherein the second switch is in a second loop with the coil assembly and, before the first large ringing pulse substantially decays, closing and opening the second switch to produce a second large ringing pulse.

25. An apparatus as defined in claim 24, wherein said first switch is a silicon controlled rectifier (SCR) forming a first electrical loop with the coil assembly and the AC power source.

26. An apparatus as defined in claim 25, wherein the second switch is electrically connected in parallel with the SCR.

27. An apparatus as defined in claim 25, further comprising a thermistor affixed to the SCR, wherein the thermistor is connected to the controller and the controller is configured to halt conduction of current through the SCR when a temperature of the SCR exceeds a predetermined maximum value.

28. An apparatus as defined in claim 25, wherein the controller includes an optical relay that when activated passes a trigger signal to the gate of the SCR and that when deactivated removes the trigger signal from the gate of the SCR.

29. An apparatus as defined in claim 24, wherein the second switch is a MOSFET.

30. An apparatus as defined in claim 24, further comprising regulating means for regulating a voltage of the ringing pulse.

31. An apparatus as defined in claim 30, wherein the regulating means includes means for adjusting the voltage of the ringing pulse to lie between a predetermined minimum value and a predetermined maximum value.

32. An apparatus as defined in claim 24, wherein the controller is configured to produce a large ringing pulse in each of a plurality of time intervals, each time interval having a duration corresponding to a portion of a cycle of a 50 or 60 Hz signal.

33. An apparatus as defined in claim 32, comprising producing a plurality of large ringing pulses in each of a plurality of time intervals, the time intervals being spaced in a way that corresponds to 50 or 60 Hz.

34. The method of claim 32, wherein each large ringing pulse after the first large ringing pulse within a time interval is initiated before the prior large ringing pulse substantially decays.

35. An apparatus for electromagnetically treating a flow of liquid, said apparatus comprising:
a coil assembly;
an AC power source connected with the coil assembly, the AC power source having a period including a first half-cycle of one polarity and a second half cycle of a polarity opposite to that of the first half-cycle;
a first switch connected in series with the coil assembly to form a series connected circuit;
a second switch connected with the coil assembly to form a second circuit; and
a controller for the first switch and the second switch, the controller being configured to: close the first switch during a first half-cycle of the AC power source period; open the first switch during a second half cycle of the AC power source period; maintain the second switch in an open condition during a first half-cycle of the AC power source; and perform a subroutine of closing and then opening the second switch to produce a first large ringing pulse in the coil assembly wherein the second switch is in a second loop with the coil assembly and, after the first large ringing pulse substantially decays, closing and opening the second switch to produce a second large ringing pulse.

36. An apparatus as defined in claim 35, comprising producing a large ringing pulse in each of a plurality of time intervals, each time interval having a duration corresponding to a portion of a cycle of a 50 or 60 Hz signal.

37. An apparatus as defined in claim 36, comprising producing a plurality of large ringing pulses in each of a plurality of time intervals, the time intervals being spaced in a way that corresponds to 50 or 60 Hz.

38. The method of claim 36, wherein each large ringing pulse after the first large ringing pulse within a time interval is initiated after the prior large ringing pulse substantially decays.

* * * * *